United States Patent
Venet et al.

(10) Patent No.: US 11,980,847 B2
(45) Date of Patent: May 14, 2024

(54) SYSTEM AND METHOD FOR REMOVING AIRBORNE MOLECULAR CONTAMINANTS FROM GAS STREAMS

(71) Applicant: ENTEGRIS, INC., Billerica, MA (US)

(72) Inventors: Marc Venet, Natick, MA (US); Jürgen M. Lobert, Franklin, MA (US); John C. Gaudreau, Chepachet, RI (US)

(73) Assignee: ENTEGRIS, INC., Billerica, MA (US)

( * ) Notice: Subject to any disclaimer, the term of this patent is extended or adjusted under 35 U.S.C. 154(b) by 828 days.

(21) Appl. No.: 17/073,651

(22) Filed: Oct. 19, 2020

(65) Prior Publication Data

US 2021/0031141 A1 Feb. 4, 2021

Related U.S. Application Data

(62) Division of application No. 15/126,909, filed as application No. PCT/US2015/021431 on Mar. 19, 2015, now Pat. No. 11,020,704.

(Continued)

(51) Int. Cl.
*B01D 53/34* (2006.01)
*B01D 46/00* (2022.01)
(Continued)

(52) U.S. Cl.
CPC ....... *B01D 53/346* (2013.01); *B01D 46/0086* (2013.01); *B01D 46/44* (2013.01);
(Continued)

(58) Field of Classification Search
CPC .. B01D 53/346; B01D 53/0454; B01D 53/72; B01D 53/82
See application file for complete search history.

(56) References Cited

U.S. PATENT DOCUMENTS 7,922,791 B2   4/2011  Grayfer
RE44,536 E   10/2013  Kishkovich
(Continued)

FOREIGN PATENT DOCUMENTS

CN   202785838 U   3/2013
CN   203392879 U   1/2014
(Continued)

OTHER PUBLICATIONS

International Preliminary Report on Patentability for Int'l Application No. PCT/US2015/021431, titled: System and Method for Removing Airborne Molecular Contaminants From Gas Streams, Date of Completion: Jun. 10, 2016.
(Continued)

*Primary Examiner* — Paul A Wartalowicz

(57) ABSTRACT

System and method for removing molecular contaminants from an air stream are disclosed. The system includes first, second and third filter. The first filter removes organic contaminants from an air stream passing through the first filter. The second filter is downstream of the first filter, is physically and chemically exchangeable with the first filter and removes organic contaminants from the air stream output of the first filter. The third filter, downstream of the second filter, is not exchangeable with the first filter or the second filter. The first position filter can be replaced by the second filter in the second position when the first filter in the first position becomes depleted as detected. A new filter in the second filter position is inserted. Replacing the depleted first filter with the second downstream filter reduces costs and waste while inserting the new filter in the second position ensures removing organic contaminants.

13 Claims, 7 Drawing Sheets

Related U.S. Application Data

(60) Provisional application No. 61/955,577, filed on Mar. 19, 2014.

(51) Int. Cl.

| | | |
|---|---|---|
| *B01D 46/44* | (2006.01) | |
| *B01D 46/62* | (2022.01) | |
| *B01D 46/88* | (2022.01) | |
| *B01D 53/04* | (2006.01) | |
| *B01D 53/72* | (2006.01) | |
| *B01D 53/75* | (2006.01) | |
| *B01D 53/82* | (2006.01) | |
| *G03F 7/00* | (2006.01) | |

(52) U.S. Cl.
CPC ............ *B01D 46/62* (2022.01); *B01D 46/88* (2022.01); *B01D 53/0454* (2013.01); *B01D 53/72* (2013.01); *B01D 53/75* (2013.01); *B01D 53/82* (2013.01); *G03F 7/70908* (2013.01); *G03F 7/70991* (2013.01); *B01D 2257/406* (2013.01); *B01D 2257/702* (2013.01); *B01D 2257/7022* (2013.01); *B01D 2257/7027* (2013.01); *B01D 2259/40084* (2013.01); *B01D 2259/41* (2013.01); *B01D 2259/4146* (2013.01); *B01D 2259/4148* (2013.01)

(56) References Cited

U.S. PATENT DOCUMENTS

| | | |
|---|---|---|
| 2002/0178923 A1 | 12/2002 | Kishkovich |
| 2003/0113943 A1 | 6/2003 | Kishkovich et al. |
| 2009/0249954 A1 | 10/2009 | Gadkaree |
| 2009/0320681 A1 | 12/2009 | Grayfer |

FOREIGN PATENT DOCUMENTS

| | | |
|---|---|---|
| CN | 103857966 B | 6/2014 |
| EP | 2226111 A1 | 9/2010 |
| FR | 2248072 B1 | 1/1978 |
| TW | 463140 U | 10/2013 |
| WO | 01085308 W | 9/2002 |
| WO | 2015143133 A1 | 9/2015 |

OTHER PUBLICATIONS

International Search Report and Written Opinion for Int'l Application No. PCT/US2015/021431, titled: System and Method for Removing Airborne Molecular Contaminants From Gas Streams, dated Jun. 1, 2015.

Step 410

> Detecting breakthrough of airborne organic contaminants from an air stream that passes through a first filter downstream of a depleted first filter.

Step 420

> Removing the depleted first filter and replacing the depleted first filter with the second filter in the second position from the stack, wherein the second filter downstream of the first filter is physically and chemically exchangeable with the first filter; and the third filter is not exchangeable with the first filter or the second filter, and the third filter removes airborne basic contaminants from the air stream output from the second filter.

Step 430

> Inserting another second prime filter in the second position, downstream of the first filter, that is physically and chemically exchangeable with the second filter now in the first position in the stack, the second prime filter removes airborne organic comtaminants from the air stream output from the second filter now in the first position in the stack.

Figure 4

SYSTEM AND METHOD FOR REMOVING AIRBORNE MOLECULAR CONTAMINANTS FROM GAS STREAMS

RELATED APPLICATION

This application is a divisional application of U.S. application Ser. No. 15/126,909, which is the U.S. National Stage of International Application No. PCT/US2015/021431, filed on Mar. 19, 2015, published in English, which claims the benefit of U.S. Provisional Application No. 61/955,577, filed on Mar. 19, 2014, entitled SYSTEM AND METHOD FOR REMOVING AIRBORNE MOLECULAR CONTAMINANTS FROM GAS STREAMS. The entire teachings of the above applications are incorporated herein by reference in their entirety.

FIELD OF THE INVENTION

This invention includes embodiments that relate to filters and method of making and using them. Particularly, the invention includes embodiments that relate to asymmetrical filters and method of making and using them.

BACKGROUND OF THE INVENTION

To filter contaminants from the air, gas phase filtration is commonly employed, typically using activated carbon manufactured in various ways. Stacks of multiple filters deployed in series is required to try to achieve a very high removal efficiency for airborne molecular contaminants (AMCs).

Some known air purification was designed to prevent the conversion of Hexamethyldisiloxane (HMDSO) to Trimethylsilanol (TMS). HMDSO is converted to TMS on acidic $NH_3$ filter media, typically employed to remove ammonia ($NH_3$). TMS is a low molecular weight/low boiling point Si-containing AMC, which quickly migrates through standard AMC filters. HMDSO is captured well on media containing activated carbon adsorbents. TMS, however, can contribute to permanent optics damage in 193 nm and 248 nm exposure tool optics.

Other known air purifications prevent the conversion of PGMEA to acetic acid. PGMEA is converted to acetic acid on acidic $NH_3$ filter media, which is usually employed to remove ammonia.

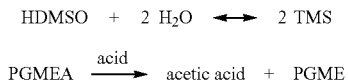

Acetic acid can contribute to resist process variation and potential material corrosion in 193 nm and 248 nm microlithography exposure tools. A disadvantage is once breakthrough was detected, an entire filter stack is replaced wherein all tree filters in the filter stack are replaced with new filters.

FIG. 1 is a schematic of a conventional symmetrical filter stack 100. The symmetrical filter stack 100 includes three filters, a first filter 10, a second filter 20, and a third filter 30. Each of the three filters 10, 20, 30 has two layers, a media layer 1 to remove airborne contaminants that are organics or acids or bases and another media layer 2 to remove airborne contaminants that are organics or acids. As shown in FIG. 1, the first filter 10 has two media layers, a media layer 1 to remove airborne contaminants that are organics or acids or bases and another media layer 2 to remove airborne contaminants that are organics or acids. Similarly, the second filter 20 has two media layers, a media layer 1 to remove airborne contaminants that are organics or acids or bases and another media layer 2 to remove airborne contaminants that are organics or acids. The third filter 30 also has two media layers, a media layer 1 to remove airborne contaminants that are organics or acids or bases and another media layer 2 to remove airborne contaminants that are organics or acids.

The filter stack 100 is symmetrical because the first, second and third filters 10, 20, 30 have the same mix or arrangement of media layers. First and second filter 10, 20 have filter media 1, 2 which are symmetrical to each other, the second and third filter 20, 30 have filter media 1,2 which are symmetrical to each other, and third and first filter 10, 20 have filter media 1,2 which are symmetrical to each other. On contact with acidic, $NH_3$-removing media, HMDSO entering a filter hydrolyzes to TMS and TMS migrates through the filter system as a volatile organic AMC. A disadvantage is that dual media layers 1, 2 of each filter 10, 20, 30 do not effectively allow removal of HMDSO by an organic removing media layer prior to contacting an $NH_3$-removing media layer; hence, HMDSO entering a filter hydrolyzes to TMS. Substituting a depleted filter 1 with partially used filter 2 would make HMDSO entering a filter and being hydrolyzed to TMS even more likely.

FIG. 2 is a schematic of a conventional asymmetrical filter stack 200. Asymmetric configuration helps minimize unwanted chemical reactions due to acidic, $NH_3$-removing media. The asymmetrical filter stack 200 includes three filters: a first filter 210, a second filter 220, and a third filter 230. Each of the 3 filters 210, 220, 230 has two media layers each. First filter 210 has two filter media, a media layer 4 to remove organics and another media layer 4 to remove organics. The second filter 220 has two media layers; a media layer 4 to remove organics and another media layer 5 remove airborne contaminants that are organics or bases. The third filter 230 has two media layers, a media layer 1 to remove airborne contaminants that are organics or acids or bases and another media layer 5 remove airborne contaminants that are organics or bases. The filter stack 200 is asymmetrical because the first, second and third filter 210, 220, 230 are not symmetrical to each other based on the media layer differences. Each filter media in 210, 220 and 230 differs from each other. First and second filter 210, 220 have filter media which differ from each other, the second and third filter 220, 230 have filter media which differ from each other, and the first and third filter 210, 230 have filter media which differ from each other.

Acidic, $NH_3$-removing media such as sulfonic or carboxylic acid based media are positioned in the last three filter layers as shown in FIG. 2. In a conventional asymmetrical filter stack 200, the second media layer 5 in the second filter 220 and the first and second media layers 5 in the third filter 230 are acidic, $NH_3$-removing media layers 5. The first three HMDSO-removing media 4 are the first and second media layers 4 in the first filter 200 and first media layer 4 in the second filter 220. Thus, HMDSO is captured by the first three organics removing media layers 4, which can be carbon based media, and prevent TMS formation while also volatile bases (amines) and acids are removed. A disadvantage is that the first and second filters 210, 220 are not exchangeable because they are not symmetrical.

Consequently, filter stacks are still needed and systems with such filters. Also needed is a method of making such filter stacks and method of removing contaminants from a gas stream using such filters.

SUMMARY OF THE INVENTION

The present invention meets these and other needs by providing a stack of replaceable filters and methods of removing airborne molecular contaminants (AMCs) with such stack of replaceable filters.

Accordingly, one aspect of the invention provides a stack of replaceable filters. The stack of replaceable filters includes a first, second and third filter. The first filter removes airborne organic contaminants from an air stream that passes through the first filter. The second filter is downstream of the first filter, is physically and chemically exchangeable with the first filter and removes airborne organic contaminants from the air stream output from the first filter. The third filter is downstream of the second filter, is not exchangeable with the first filter or the second filter and removes basic airborne from the air stream output from the second filter. An initial capacity of the first filter and an initial capacity of the second filter for removal of airborne organic contaminants are within +/−25% as measured in part per billion-hours at a same gas flow rate and contaminant input challenge and the second filter has a capacity for airborne organic contaminants sufficient to permit exchange with a depleted first filter in an exchangeable stack.

A second aspect of the invention provides a stack of replaceable filters. The stack of replaceable filters includes a first, second and third filter. The first filter removes airborne organic contaminants from an air stream that passes through the first filter. The first filter has removed airborne organic contaminants that can be detected. The second filter is downstream of the first filter, is physically and chemically exchangeable with the first filter and removes airborne organic contaminants from the air stream output from the first filter. The second filter has removed less airborne organic contaminants compared to the first filter. The third filter is downstream of the second filter, is not exchangeable with the first filter or the second filter and removes airborne basic contaminants from the air stream output from the second filter.

A third aspect of the invention provides a method of replacing filters in a stack of replaceable filters comprising a first, second, and third filter. The method includes:
  i) detecting breakthrough of airborne organic contaminants from an air stream that passes through a first filter downstream of a depleted first filter;
  ii) removing the depleted first filter and replacing the depleted first filter with the second filter in the second position from the stack, wherein the second filter downstream of the first filter is physically and chemically exchangeable with the first filter; and the third filter is not exchangeable with the first filter or the second filter, and the third filter removes airborne basic contaminants from the air stream output from the second filter; and
  iii) inserting another second prime filter in the second position, downstream of the second filter now in first position in the stack, that is physically and chemically exchangeable with the second filter now in first position in the stack, the second prime filter removes airborne organic contaminants from the air stream output from the filter in second filter now in first position in the stack.

The accompanying figures, which are incorporated in and constitute part of this specification, are included to illustrate and provide a further understanding of the method and system of the invention. Together with the description, the figures serve to explain the principles of the invention. It is contemplated that features from one embodiment may be beneficially incorporated in other embodiments without further recitation.

BRIEF DESCRIPTION OF THE DRAWINGS

FIG. 4 is a flow chart of a method of replacing an filter in an asymmetrical stack of replaceable filters in accordance with an embodiment of the invention;

To facilitate understanding, identical reference numerals have been used, wherever possible, to designate identical elements that are common to the figures.

DETAILED DESCRIPTION

Figure 1:
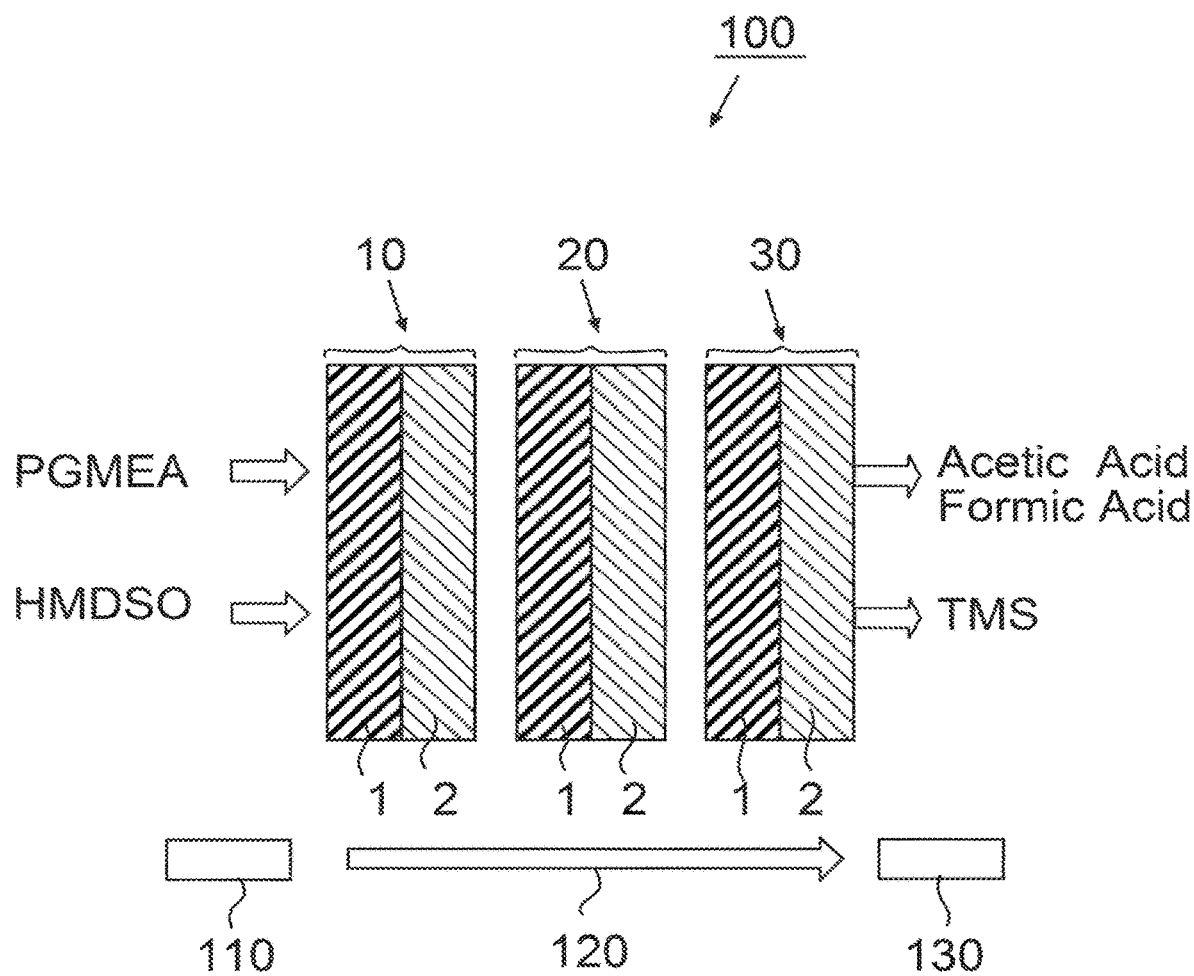
FIG. 1 is a schematic of a conventional symmetrical filter stack.
Figure 2:
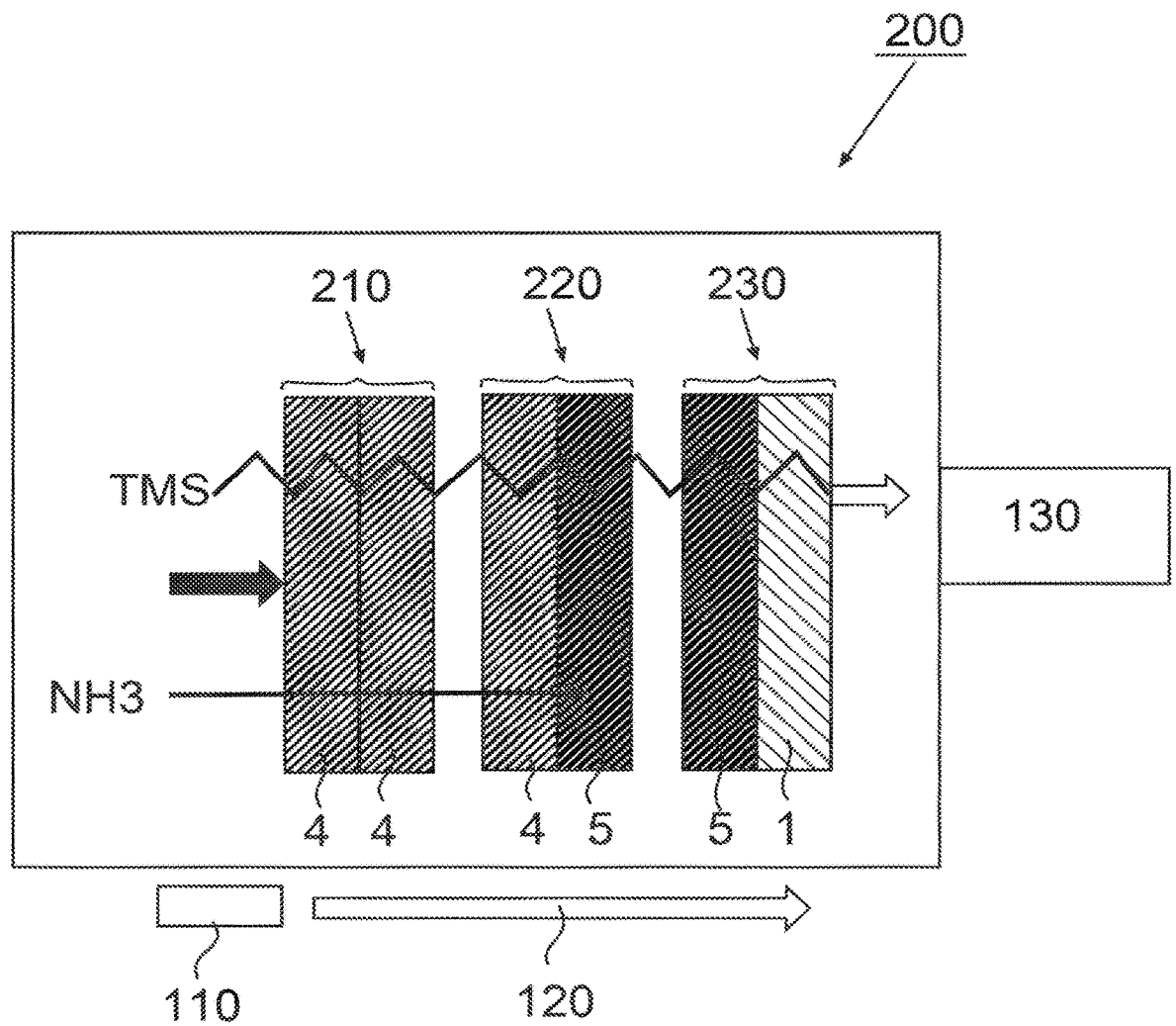
FIG. 2 is a schematic of a conventional asymmetrical filter stack.

In the following description, it is understood that terms such as "top," "bottom," "outward," "inward," and the like are words of convenience and are not to be construed as limiting terms. Reference will now be made in detail to exemplary embodiments of the invention, which are illustrated in the accompanying figures and examples. Referring to the drawings in general, it will be understood that the illustrations are for the purpose of describing a particular embodiment of the invention and are not intended to limit the invention thereto.

Whenever a particular embodiment of the invention is said to comprise or consist of at least one element of a group and combinations thereof, it is understood that the embodiment may comprise or consist of any of the elements of the group, either individually or in combination with any of the other elements of that group. Furthermore, when any variable occurs more than one time in any constituent or in formula, its definition on each occurrence is independent of its definition at every other occurrence. Also, combinations of substituents and/or variables are permissible only if such combinations result in stable compounds.

Figure 3:
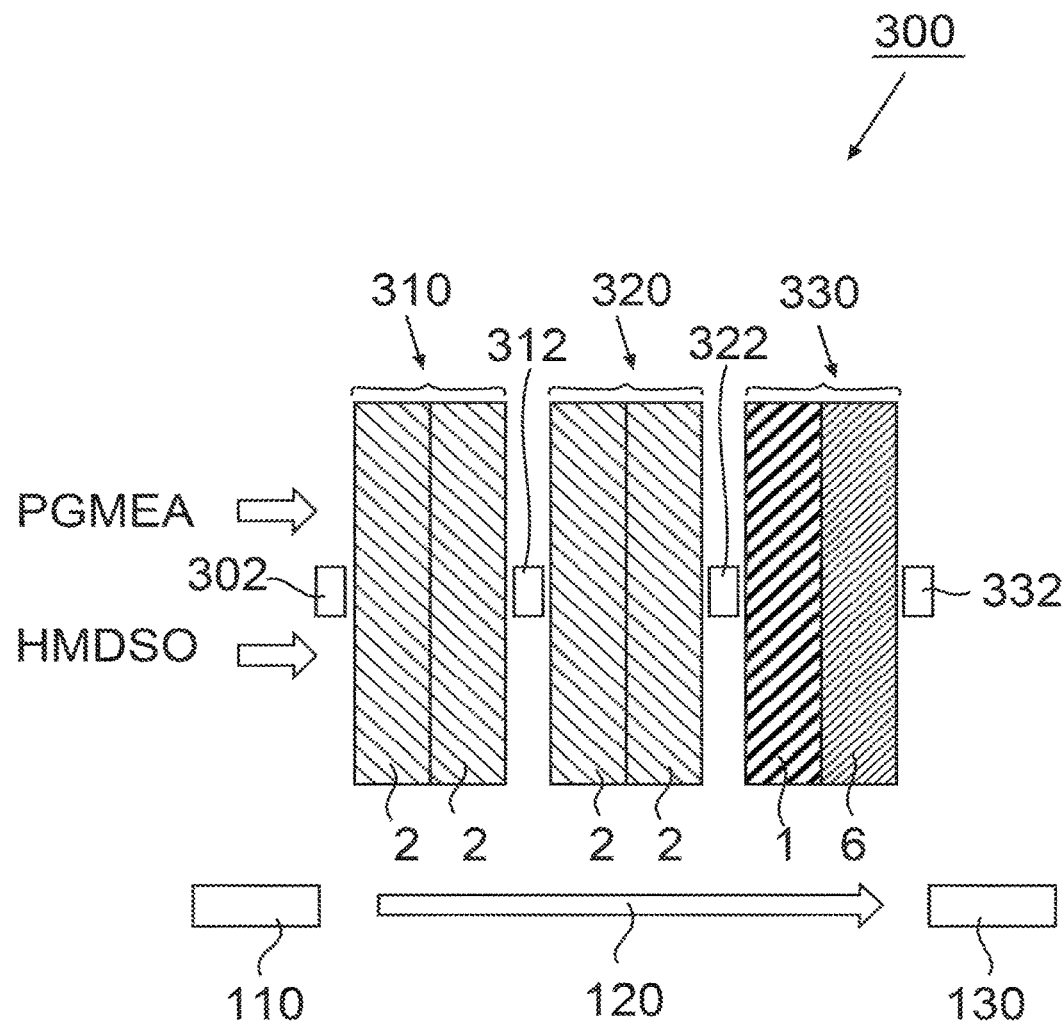
FIG. 3 is a schematic of an asymmetrical filter stack in accordance with an embodiment of the invention.

With reference to FIG. 3, an asymmetrical stack of replaceable 300 is described in accordance with an embodiment of the invention. The stack of replaceable filters 300 includes a first filter 310, second filter 320, and third filter 330 The first filter 310, in the first filter position, removes one or more airborne organic contaminants from an air stream that passes through the first filter 310. The second filter 320, in the second position, is downstream of the first filter, is physically and chemically exchangeable with the first filter and removes airborne organic contaminants from the air stream output from the first filter 310. The third filter 330, in the third position, is downstream of the second filter 320, is not exchangeable with the first filter 310 or the second filter 320 and removes one or more airborne basic contaminants from the air stream output from the second filter 320. In an embodiment, an initial capacity of the first filter 310 and an initial capacity of the second filter 320 for removal of airborne organic contaminants are within +/−25% as measured in part per billion-hours at a same gas flow rate and contaminant input challenge) and the second filter 320 has a capacity for airborne organic contaminants sufficient to permit exchange with a depleted first filter in the stack of replaceable filters 300.

Each filter 310, 320, 330 has one or more media layers. In an embodiment, a filter 310, 320, 330 includes two media layers. In an embodiment, the first filter 310 includes two media layers 2, wherein both the media layers 2 remove one or more airborne contaminants that are organics or acids. The second filter 320 also includes two media layers 2 wherein both the media layers 2 remove one or more airborne contaminants that are organics or acids. It should be appreciated that embodiments of first and second filters 310, 320 may include further media layers which are symmetrical to each other or differ from each. The third filter 330 has two media layers which differ from each. The two media layers for the third filter 330 are media layer 1 to remove airborne contaminants that are organics or acids or bases and media layer 6 to remove airborne contaminants that are weak acids or bases. It should be appreciated that embodiments of the third filter 330 includes further media layers which differ from the media layers in the first and second filters 310, 320. It should also be appreciated that a filter stack may further include other filters and the plurality of filters may have various characteristics.

The stack of replaceable filters 300 are asymmetrical because although the first and second filters 310, 320 are similar or exchangeable based on the symmetry or similarity of the media layers, the third filter 320 differs from the first and second filter 310, 320, because the media layers of the third filter 330 differs from the media layers of the first and second filters 310, 320. Thus, the stack of replaceable filters 300 is asymmetrical because the third filter 320 differs from the first and second filters 310, 320.

In an embodiment, the airborne organic contaminants removed by first filter 310 and second filter 320 includes airborne organic contaminants such as, but not limited to, hexamethydisiloxane (HMDSO), propylene glycol monomethyl ether acetate (PGMEA), and toluene, either individually or in combinations of two or more thereof. It should be understood that it is within and included in the scope of the invention to have a first filter 310 and second filter 320 removing a plurality of airborne organic contaminants which may have various characteristics which differ or are similar to each other. In an embodiment, the airborne organic contaminants removed by first filter 310 and second filter 320 includes HMDSO. In another embodiment, the airborne organic contaminants removed by the first filter 310 and second filter 320 include PGMEA. In yet another embodiment, the airborne organic contaminants removed by first filter 310 and second filter 320 includes toluene. It should be appreciated that embodiments includes a first filter 310 and second filter 320 removing a plurality of airborne organic contaminants which may have various characteristics, which differ or are similar to each other. In an embodiment, the plurality of organic contaminants removed by first filter 310 and second filter 320 include HMDSO and PGMEA.

In another embodiment, the first filter 310 removes airborne organic contaminants and the second filter 320 removes less airborne organic contaminants compared to the first filter 320. In a particular embodiment, the first filter 310 has removed airborne organic contaminants such as but not limited to HMDSO or PGMEA that can be detected and the second filter 320 has removed less organic contaminants such as but not limited to HMDSO or PGMEA compared to the first filter as detected.

In an embodiment, the airborne basic contaminants removed by third filter 330 includes bases such as but not limited to ammonia, organic primary, secondary or tertiary amine, etc. either individually or in combinations of two or more thereof. It should be understood that it is within and included in the scope of the invention to have a third filter 330 removing a plurality of airborne basic contaminants which may have various characteristics. In a particular embodiment, the airborne basic contaminants removed by third filter 330 include bases such as ammonia.

In an embodiment, the stack of replaceable filters 300 further includes monitor mechanism to measure breakthrough of air borne contaminants through each of the filters in the stack, and an inlet stack monitor at the inlet of the stack. An embodiment include four monitor mechanisms to measure one or more AMC concentrations in the gas downstream of each filter: a first interstack monitor 312 in the first interstack which is downstream of the first filter 310 and upstream of the second filter 320 to measure breakthrough of air borne contaminants from the first filter 310; a second interstack monitor 322 which is downstream of the second filter 320 and upstream of the third filter 320 to measure breakthrough of air borne contaminants from the second filter 320; an inlet stack monitor 302 at the inlet of the stack upstream of the first filter and outlet stack monitor 332 at the outlet of the stack downstream of the third filter 330. In a particular embodiment, the monitor includes a sensor. See for example Patent application WO/2001/085308 which is incorporated by reference in its entirety.

An embodiment of the invention includes a gas cabinet housing comprising one or more replaceable filter stacks 300. A particular embodiment includes two parallel filter stacks 300 stacked on top of each other in front and 2 other filter stacks 300 behind. Each filter stack 300 has an outlet filter and two upstream filters, is exchangeable with the first right most filter. Although described with four filter stacks 300 in a gas cabinet, less or great number of filter stacks in a gas cabinet of varying size are within the scope of the invention.

Advantages of the invention may include such as, but not limited to, the following.

For illustration and not limitation, embodiments and advantages of the invention for an asymmetrical stack of replaceable filters 300 are compared to conventional a stack of asymmetrical filter stack 200 and symmetrical filter stack 100. Applicants unexpectedly recognized that final two amine removing layers, or final filter, in stack had sufficient capacity to remove amines or ammonia from air during normal use and that it was possible to replace the amine removing media such as media 5 of the second filter 220 in a conventional asymmetrical filter 200 with an organics removing media layer 2 to make the second filter 320 substantially the same as the first filter 310. Applicant further also unexpected discovered that when the first filter 310 was exhausted, first filter 310 can be replaced by the partially used second filter 320 from the stack 300. The second filter 320 could be replaced with a new filter in the second filter position.

As depicted in FIG. 1, in convention symmetrical stack of filters 100, all three filters, 10, 20, 30 share the same mix or arrangement of dual media layers (media layer 1 to remove organics or acids and media layer 2 to remove organics or bases ($NH_3$) wherein the dual symmetric layers of each filter do not effectively remove HMDSO by an organic layer prior to contacting $NH_3$-removing media layer, allowing HMDSO to enter a filter to hydrolyzes to TMS. Substituting a depleted first filter with a partially used second filter two in a second downstream position from a first filter would make HMDSO entering a filter even more likely to hydrolyze to TMS, In contrast to the known symmetrical filter stack 100 FIG. 1, advantages of Applicant's filter stack 300 include first filter 310 capable of being replaced by the partially used second filter 320 from the filter stack 300 when first filter 310 is depleted. The second filter 320 could be replaced with a new filter in the second filter position.

Embodiments of the invention also include methods of replacing a filter in an asymmetrical stack of replaceable filters 300.

With reference to FIG. 4, next is described an embodiment of the invention of replacing a filter 310 in an asymmetrical stack 300 of replaceable filters. FIG. 4 is a flow chart of an embodiment of a method of replacing a filter in an asymmetrical stack of replaceable filters 300. The method is not limited by the order or frequency of the steps unless expressly noted. The method includes Step 410 detecting breakthrough of airborne organic contaminants from an air stream that passes through a first filter 310 downstream of a depleted first filter. Depleted filter means when a filter reaches a specified removal efficiency (RE). In an embodiment, depleted filter means when a filter reaches a specified RE of 75% or lower. In another embodiment, depleted filter means when a filter reaches a specified RE of 70% or lower. In yet another embodiment, depleted filter means when a filter reaches a specified RE of 65% or lower. In another embodiment, depleted filter means when a filter reaches a specified RE of 60% or lower. It should be understood that it is within and included in the scope of the invention to adjust various parameter settings to achieve a specified objective. Examples of such parameters include RE, temperature, pressure, and the residence time. It should also be understood that the invention is not limited by such parameter setting. In a particular embodiment, invention includes adjust parameter setting of RE to achieve a specified filtering objective.

Step 420 includes removing the depleted first filter 310 and replacing the depleted first filter 310 with the second filter 320 in the second position from the stack, wherein the second filter 320 downstream of the first filter is physically and chemically exchangeable with the first filter 310; and the third filter is not exchangeable with the first filter 310 or the second filter 320, and the third filter 330 removes airborne basic contaminants from the air stream output from the second filter. Step 430 includes inserting another second prime filter 320' in the second position, downstream of the second filter now in first position in the stack, that is physically and chemically exchangeable with the second filter now in first filter position in the stack, the second filter 320' removes airborne organic contaminants from the air stream output from the second filter now in first position in the stack. Prime symbol designated new filter.

In an embodiment, when the first filter 310 reached a 70% removal efficiency (RE), the second position filter, which is still operating at a RE of 100-99% is moved into the first position and a new filter is put in second filter position. This is done twice for each filter stack (for a total of three filter cycles).

Figure 5:
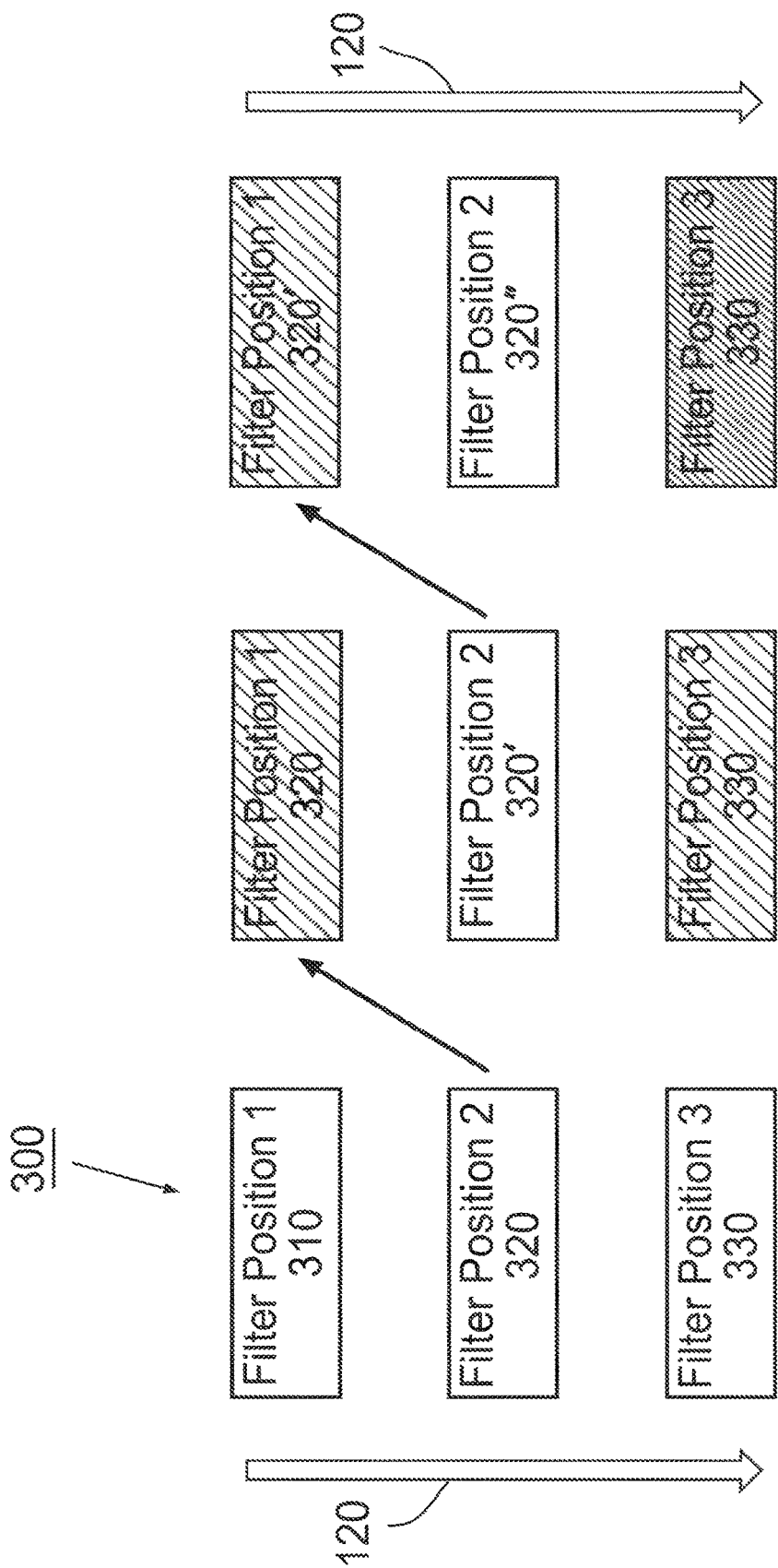
FIG. 5 is a schematic of replacing a filter in an asymmetrical stack of replaceable filters in accordance with an embodiment of the invention.

FIG. 5 is a schematic of replacing a filter 310 in an asymmetrical stack 300 of replaceable filters in accordance with an embodiment of the invention. When the first filter 310 reached a specified removal efficiency (RE), the first filter 310 is removed. The second filter 320 which is in the second position, which is still operating at a RE of 100-99% is moved into the first position as designated by the arrow and a new second prime filter 320' is put in the second position filter. The process may be repeated for each filter stack (for a total of three filter cycles).

The method further includes detecting breakthrough of airborne organic contaminant from an air stream that passes through the second filter 320 which is now in first position; removing the depleted second filter 320 in first position and replacing the depleted second filter 320 in first position with the second prime filter 320' in the second position in the filter stack 300, wherein the second prime filter 320' downstream of the filter in first position is physically and chemically exchangeable with the first filter 310; and inserting another used second double prime filter 320" in the second position, downstream of the filter in the first position, that is physically and chemically exchangeable with the filter in the first position in the filter stack 300. Specifically, the second double prime filter 320" is physically and chemically exchangeable with the second prime filter 320' now in first position in the filter stack 300. The second double prime filter 320" removes airborne organic contaminants from the air stream output from the first filter.

Applicants unexpectedly recognized that final two amine removing layers, or final filter, in stack had sufficient capacity to remove amines or ammonia from air during normal use and that it was possible to replace the amine removing media such as media 5 of the second filter 220 in a conventional asymmetrical filter 200 with an organics media layer to make the second filter 330 substantially the same as the first filter 310 and further, that when the first filter 310 was exhausted, first filter 310 can be replace by the partially used second filter 320 from the stack 300. The second filter 320 could be replaced with a new filter in the second position.

Unexpected advantages of the invention include such as, but not limited to, the following. Media and filter stacking removes organic contaminants before the organic contaminants can be converted to TMS, acetic acid and formic acid. The second filter 320 in second downstream position of the first filter 310 can replace the first filter 310 when the first filter 310 is depleted as detected by breakthrough. With the dual organic contaminant removal layers 2, the second filter 320 continues removing organic contaminants, as now the first position filter upstream of two other filters in a stack of three filters 300.

EXAMPLES

The following examples illustrate the features of embodiments of the invention and are not intended to limit the invention thereto.

The filters were tested in dedicated test tunnel in three filter stack configuration. Data collection entailed AMC sampling at inlet, interstack 1 (downstream of filter 1), interstack 2 (downstream of filter 2) and outlet. Removal efficiency (RE) of a particular filter is defined as the ratio of (1—outlet concentration)/inlet concentration. Example: with inlet concentration of 1000 ppb an outlet concentration of 300 ppb would be 70% RE.

The filters were tested with 1 ppm each of toluene and ammonia at 0.5 m/s under standard temperature and humidity conditions of 20° C.±3° C. and ~40% RH respectively.

In cycle 1, the filter stack 300 of three filters 310, 320, and 330, was evaluated for toluene and ammonia performance at a challenge of 1 ppm. When the first position filter 310 reached 70% removal efficiency (RE), it was replaced by the second position filter 320, which was operating at a RE of 100-99%. A new filter 320' was then placed in the second position. This is cycle 2. Cycle 3 is when cycle 2 is repeated. In other words, when the first position filter 310 reaches 70% removal efficiency (RE), it is replaced by the second position filter 320, which is operating at a RE of 100-99%. A new filter 320' was then placed in the second position. Thus a total of 5 filters are tested in these 3 cycles. A schematic of the testing and filter swap-out Protocol is shown in FIG. 5.

Filter life are shown in hatch mark. When the first filter 310 reached 70% removal efficiency (RE), the second position filter 320 which is still operating at a RE of 100-99% is moved into the first position and a new filter 320' is put in position 2. This is done twice for each filter stack (for a total of three filter cycles).

Figure 6:
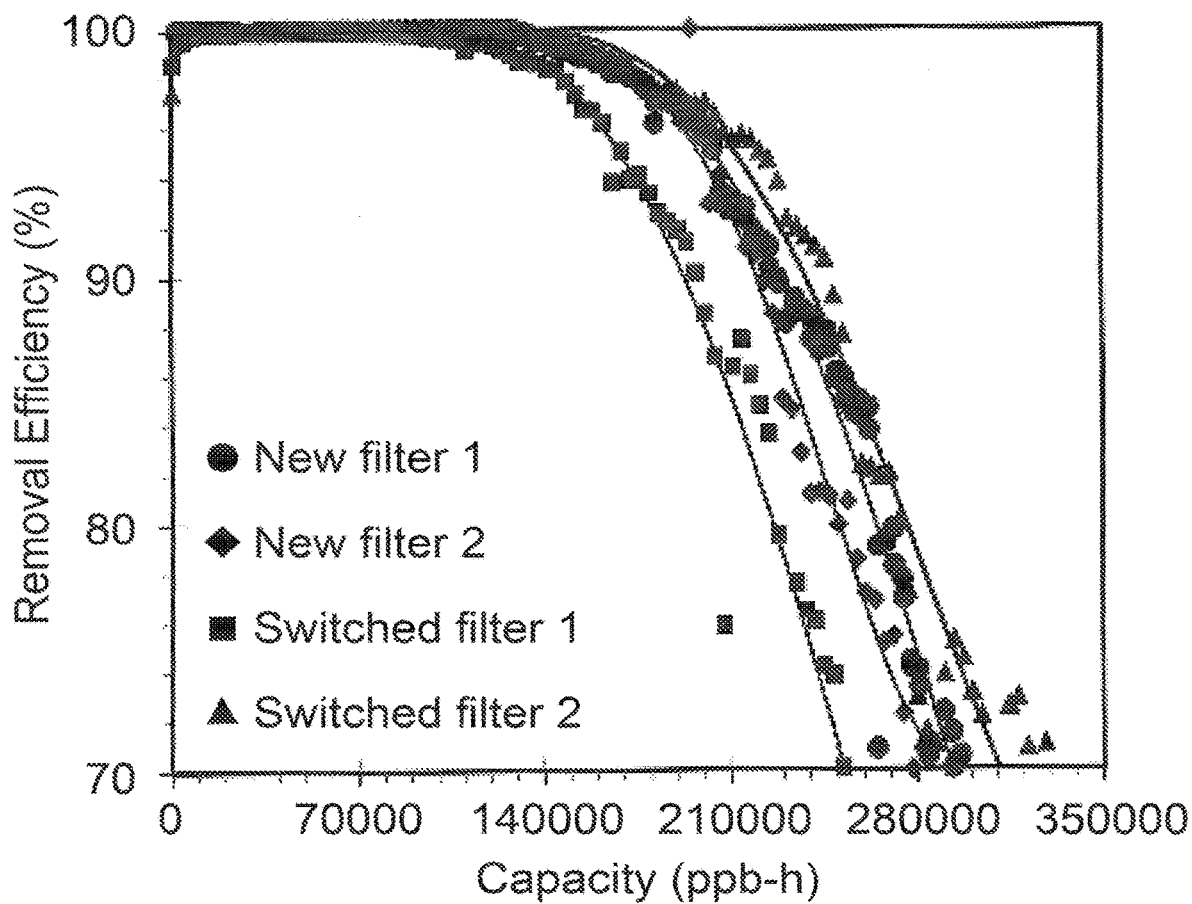
FIG. 6 shows the toluene capacity in ppb-h for position 1 filters at different removal efficiencies in accordance with an embodiment of the invention.

FIG. 6 shows the toluene capacity in ppb-h for position 1 filters at different removal efficiencies. FIG. 6 includes both, the two new filters (shown by circles and diamonds) and the two switched filters (shown by squares and triangles). FIG. 6 clearly shows that the toluene performance of the partially loaded switched filters is not significantly different from the new filters, and thereby helps in increasing the capacity of the filter stack.

Table 1 shows the data for the filter capacities for toluene at the different removal efficiencies (RE). The data is clearly indicative of similar performances for all RE values within filter variability limits.

TABLE 1

Stack toluene capacity for position 1 filters as new and switched filters

| Description | Capacity (ppb-h) @ RE | | |
|---|---|---|---|
| | 99% | 90% | 70% |
| New filter 1 | 150000 | 230000 | 290000 |
| New filter 2 | 150000 | 220000 | 280000 |
| Switched filter 1 | 130000 | 195000 | 250000 |
| Switched filter 2 | 160000 | 240000 | 310000 |

Figure 7:
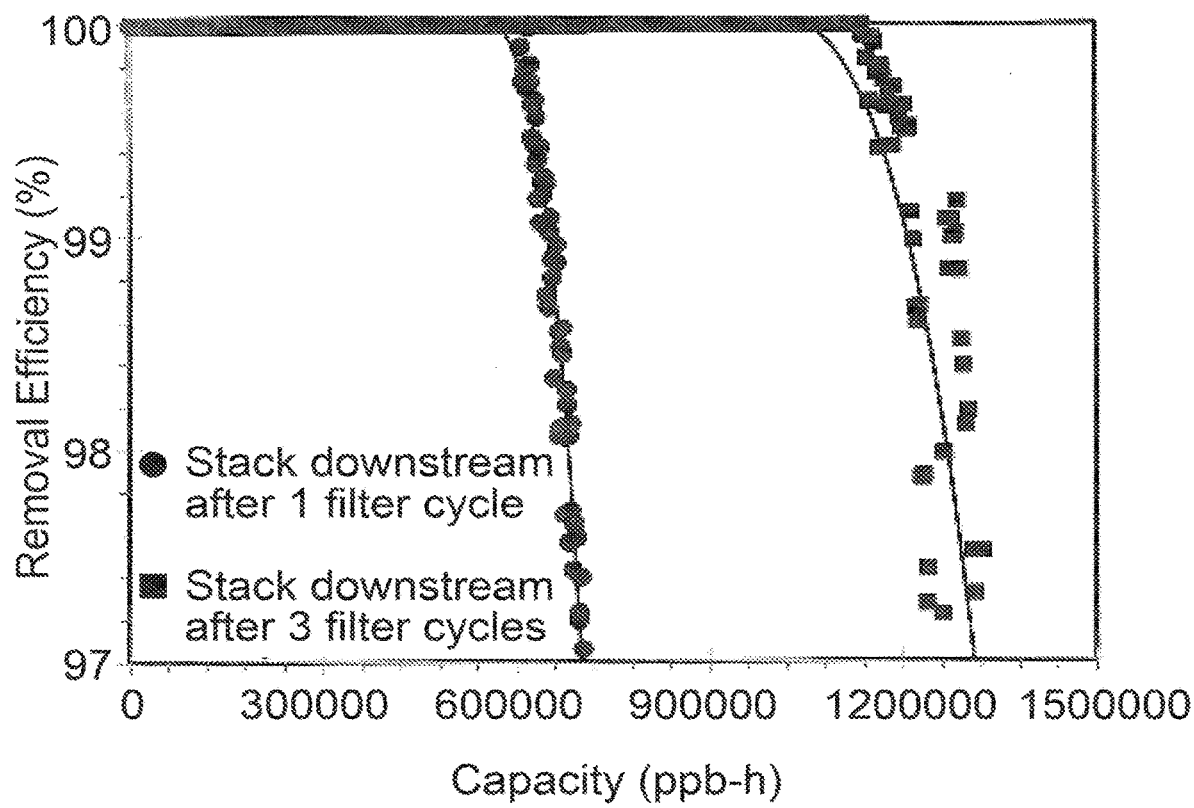
FIG. 7 shows the toluene capacity of a filter stack after one filter cycle and three filter cycles at different removal efficiencies in accordance with an embodiment of the invention.

FIG. 7 shows the toluene capacity of the filter stack after one filter cycle (shown by black circles) and three filter cycles (shown by black squares) at different removal efficiencies. As expected, the stack performance for toluene shows significantly higher values for the 3 filter cycles when compared to that for the 1 filter cycle.

TABLE 2

Stack toluene capacity for filter stacks in one and three filter cycles.

| Description | Capacity (ppb-h) @ RE | |
|---|---|---|
| | 99% | 97% |
| Stack downstream after 1 filter cycle | 650000 | 700000 |
| Stack downstream after 3 filter cycle | 1200000 | 1300000 |

Table 2 shows the filter capacities for toluene at the two removal efficiencies of 99 & 97%. The 3 filter cycle stack performance is clearly significantly higher than that for one cycle stack by an average of 85% at both RE values.

Approximating language, as used herein throughout the specification and claims, may be applied to modify any quantitative or qualitative representation that could permissibly vary without resulting in a change in the basic function to which it is related. Accordingly, a value modified by a term such as "about" or numerical ranges is not to be limited to a specified precise value, and may include values that differ from the specified value. In at least some instances, the approximating language may correspond to the precision of an instrument for measuring the value. Furthermore, "removing or adsorbing" may be used in combination with a term, and include a varying amount of airborne contaminant removal and is not to be limited to a specified precise value, and may include values that differ from a specified value.

It will be apparent to those skilled in the art that various modifications and variations can be made in the method and system of the present invention without departing from the spirit or scope of the invention. Thus, it is intended that the present invention include modifications and variations that are within the scope of the appended claims and their equivalents.

While the invention has been described in detail in connection with only a limited number of aspects, it should be understood that the invention is not limited to such disclosed aspects. Rather, the invention can be modified to incorporate any number of variations, alterations, substitutions, or equivalent arrangements not heretofore described, but which are commensurate with the scope of the claims. Additionally, while various embodiments of the invention have been described, it is to be understood that aspects of the invention may include only some of the described embodiments. Accordingly, the invention is not to be seen as limited by the foregoing description, but is only limited by the scope of the appended claims.

REFERENCE NUMERALS IN FIG. 1 PRIOR ART

100 symmetrical Filter stack
  1st Filter 1=10
    Media 1=Organics/acids/bases
    Media 2=Organics/acids
  2nd Filter 2=20
    Media 1=Organics/acids/bases
    Media 2=Organics/acids
  3rd filter=30
    Media 1=Organics/acids/bases
    Media 2=Organics/acids
  Inlet=110
  Airflow=120
  Scanner=130

REFERENCE NUMERALS IN FIG. 2 PRIOR ART

200 asymmetrical Filter stack
  1st Filter=210
    Media 4=organics
    Media 4=organics
  2nd Filter=220
    Media 4=organics
    Media 5=organics/base 3rd Filter=230
   Media 5=organics/base
   Media 1=Organics/acids/bases
Inlet=110
Airflow=120
Scanner=130

REFERENCE NUMERALS IN FIG. 3

300 asymmetrical filter stack
   1st filter=310
      Media 2=Organics/acids
      Media 2=Organics/acids
   2nd filter=320
      Media 2=Organics/acids
      Media 2=Organics/acids
   3rd filter=330
      Media 1=Organics/acids/bases
      Media 6=weak acid/bases
   320' first new second filter
   320" second new second filter
Monitor mechanism:
   302 at inlet
   312 interstack 1
   322 interstack 2
   332 outlet s
Inlet=110
Airflow=120
Scanner=130

REFERENCE NUMERALS IN FIG. 4

410—method step
420—method step
430—method step

REFERENCE NUMERALS IN FIG. 5

300—asymmetrical stack of replaceable filters
310—first filter
320—second filter
320'—second prime filter
320"—second double prime filter
330—third filter
120—air flow

What is claimed is:

1. A method of replacing filters in a stack of replaceable filters comprising a first filter in a first position, a second filter in a second position downstream of the first filter, and third filter in a third position downstream of the second position comprising:
   i) passing an air stream through the filter stack, wherein the first filter comprises a media layer that removes airborne contaminants from the air stream, the second filter is physically and chemically exchangeable with the first filter and comprises a media layer that removes airborne contaminants from an air stream output from the first filter; and the third filter is not physically and chemically exchangeable with the first filter or the second filter and comprises a media layer that is capable of removing a base from an air stream output from the second filter;
   ii) detecting breakthrough of an airborne organic contaminant from the air stream downstream of the first filter indicating a depleted first filter;
   iii) removing the depleted first filter from the first position in the stack and replacing the depleted first filter with the second filter in the second position in the stack; and
   iv) inserting a replacement second filter in the second position, downstream of the second filter now in the first position in the stack, that is physically and chemically exchangeable with the second filter now in the first position in the stack.

2. The method of claim 1, wherein the replacement second filter comprises a media layer that removes the detected airborne organic contaminant from an air stream output from the second filter now in the first position in the stack.

3. The method of claim 1, further comprising:
   i) detecting breakthrough of an airborne organic contaminant from an air stream that passes through the second filter now in the first position, indicating that this second filter is depleted;
   ii) removing the depleted second filter from the first position in the stack and replacing the depleted second filter with the replacement second filter in the second position in the stack;
   iii) inserting another replacement second filter in the second position, downstream of the replacement second filter now in first position in the stack, that is physically and chemically exchangeable with the replacement second filter now in first position in the stack.

4. The method of claim 1, wherein the media layer of the first filter removes airborne contaminants selected from the group consisting of organics and acids from the air stream.

5. The method of claim 4, wherein the media layer of the second filter removes airborne contaminants selected from the group consisting of organics and acids from the air stream.

6. The method of claim 1, wherein the first and second filters remove airborne organic contaminants comprising hexamethyldisiloxane.

7. The method of claim 1, wherein the first and second filters remove airborne organic contaminants comprising propylene glycol monomethyl ether acetate.

8. The method of claim 1, wherein the first and second filters remove airborne organic contaminants comprising toluene.

9. The method of claim 1, wherein the first and second filters remove airborne organic contaminants comprising a plurality of organic contaminants.

10. The method of claim 9, wherein the plurality of organic contaminants comprises hexamethyldisiloxane and hexamethyldisiloxane.

11. The method of claim 1, wherein the media layer of the third filter removes base contaminants comprising ammonia.

12. The method of claim 1, wherein the breakthrough of the airborne organic contaminant from the air stream downstream of the first filter is detected using a four monitor mechanism comprising: a first interstack monitor positioned downstream of the first filter and upstream of the second filter; a second interstack monitor positioned downstream of the second filter and upstream of the third filter; an inlet stack monitor at the inlet of the stack upstream of the first filter; and outlet stack monitor at the outlet of the stack downstream of thethird filter.

13. The method of claim 12, wherein a monitor mechanism of the four monitor mechanism comprises sensors.

\* \* \* \* \*